(12) United States Patent
Haba et al.

(10) Patent No.: US 8,222,725 B2
(45) Date of Patent: Jul. 17, 2012

(54) METAL CAN IMPEDANCE CONTROL STRUCTURE

(75) Inventors: Belgacem Haba, Saratoga, CA (US); Ellis Chau, San Jose, CA (US); Wael Zohni, San Jose, CA (US); Richard Dewitt Crisp, Hornitos, CA (US)

(73) Assignee: Tessera, Inc., San Jose, CA (US)

( * ) Notice: Subject to any disclaimer, the term of this patent is extended or adjusted under 35 U.S.C. 154(b) by 121 days.

(21) Appl. No.: 12/883,811

(22) Filed: Sep. 16, 2010

(65) Prior Publication Data

US 2012/0068365 A1 Mar. 22, 2012

(51) Int. Cl.
*H01L 23/02* (2006.01)

(52) U.S. Cl. .......................... 257/686; 257/777; 438/109

(58) Field of Classification Search .................. 257/686, 257/777, 704, 784, 699, 659; 438/107, 109, 438/110
See application file for complete search history.

(56) References Cited

U.S. PATENT DOCUMENTS

| | | | |
|---|---|---|---|
| 4,680,613 A | 7/1987 | Daniels et al. | |
| 5,394,010 A * | 2/1995 | Tazawa et al. | 257/686 |
| 5,468,999 A | 11/1995 | Lin et al. | |
| 5,523,621 A | 6/1996 | Kikuchi | |
| 5,606,196 A | 2/1997 | Lee et al. | |
| 5,639,989 A | 6/1997 | Higgins, III | |
| 5,835,988 A * | 11/1998 | Ishii | 257/684 |
| 5,880,403 A * | 3/1999 | Czajkowski et al. | 174/387 |
| 6,001,671 A | 12/1999 | Fjelstad | |
| 6,445,594 B1 | 9/2002 | Nakagawa et al. | |
| 6,476,506 B1 | 11/2002 | O'Connor et al. | |
| 6,518,659 B1 * | 2/2003 | Glenn | 257/704 |
| 6,538,336 B1 | 3/2003 | Secker et al. | |
| 6,667,546 B2 | 12/2003 | Huang et al. | |
| 6,770,822 B2 | 8/2004 | Pasternak et al. | |
| 6,812,580 B1 | 11/2004 | Wenzel et al. | |
| 7,217,997 B2 | 5/2007 | Wyland | |
| 7,303,113 B2 | 12/2007 | Kwark et al. | |
| 7,456,505 B2 | 11/2008 | Gospodinova et al. | |
| 7,466,021 B2 | 12/2008 | Fjelstad | |
| 7,468,560 B2 | 12/2008 | Guengerich et al. | |
| 7,528,011 B2 | 5/2009 | Yano et al. | |
| 7,537,962 B2 | 5/2009 | Jang et al. | |
| 7,923,851 B2 | 4/2011 | Haba et al. | |
| 2001/0015490 A1 | 8/2001 | Lee | |
| 2003/0090001 A1 | 5/2003 | Beatson et al. | |
| 2004/0164389 A1 | 8/2004 | Lee | |
| 2005/0006742 A1 | 1/2005 | Sugiyama et al. | |
| 2005/0098870 A1 | 5/2005 | Thomas et al. | |
| 2005/0116013 A1 | 6/2005 | Kwark et al. | |
| 2006/0049505 A1 | 3/2006 | Wyland | |

(Continued)

*Primary Examiner* — S. V. Clark
(74) *Attorney, Agent, or Firm* — Lerner, David, Littenberg, Krumholz & Mentlik, LLP

(57) ABSTRACT

A microelectronic assembly includes an interconnection element, element contacts, first and second metal layers, conductive elements, and first and second microelectronic devices. The first metal layer may extend beyond at least one of the edges of the first microelectronic device. The conductive elements may respectively extend beyond at least one of the edges of the first metal layer. The first metal layer may have a surface disposed at a substantially uniform spacing from at least substantial portions of the conductive elements, such that a desired impedance may be achieved for the conductive elements. The conductive elements may be spaced a smaller distance from the metal layer than the distance of the conductive elements from the front surface of the first microelectronic device. The second metal layer may be connectable to a source of reference potential.

64 Claims, 9 Drawing Sheets

U.S. PATENT DOCUMENTS

| | | |
|---|---|---|
| 2006/0125079 A1 | 6/2006 | Wyland et al. |
| 2006/0131742 A1 | 6/2006 | Tzu |
| 2006/0175712 A1 | 8/2006 | Lyn et al. |
| 2006/0180916 A1 | 8/2006 | Wyland |
| 2007/0105272 A1 | 5/2007 | Lee et al. |
| 2007/0170601 A1 | 7/2007 | Miyaki et al. |
| 2008/0088012 A1 | 4/2008 | Ohkawa |
| 2008/0111248 A1 | 5/2008 | Foong et al. |
| 2010/0230828 A1 | 9/2010 | Haba et al. |
| 2010/0232128 A1 | 9/2010 | Haba et al. |
| 2010/0270667 A1* | 10/2010 | Tong et al. ............ 257/682 |

* cited by examiner

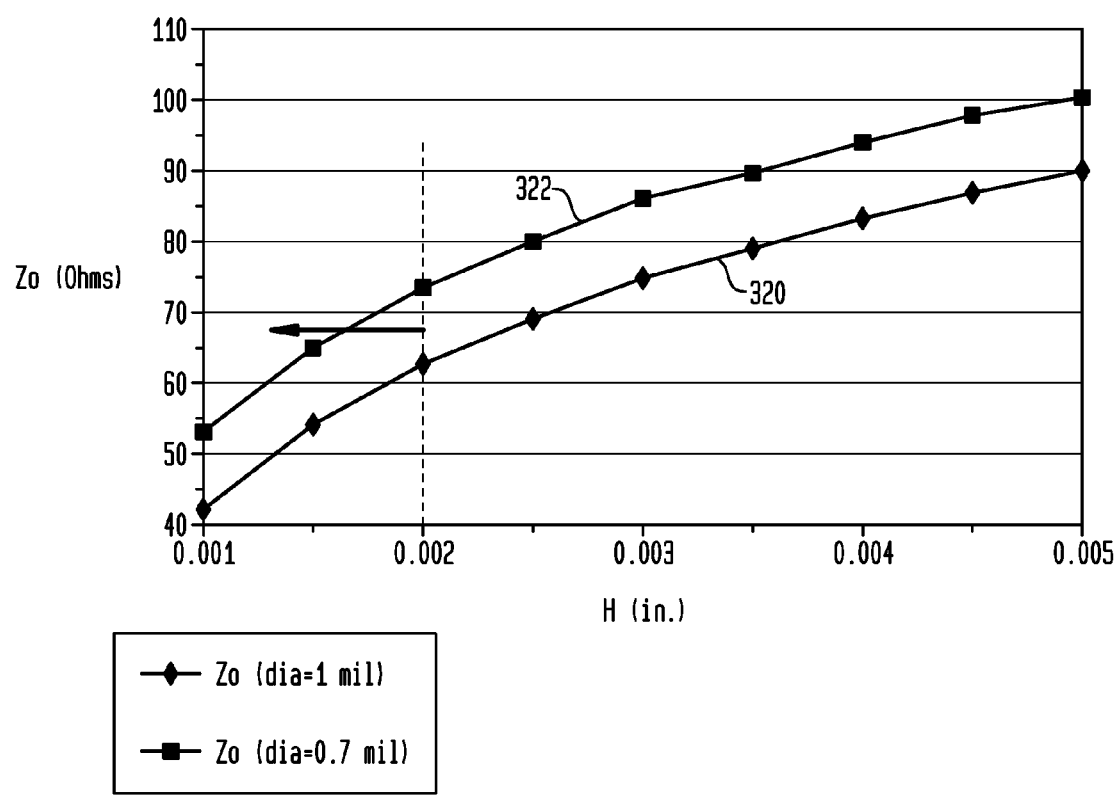

METAL CAN IMPEDANCE CONTROL STRUCTURE

BACKGROUND OF THE INVENTION

Microelectronic chips are typically flat bodies with oppositely facing, generally planar front and rear surfaces with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit (e.g. a circuit in an electronic product such as a computer or a cell phone) by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing can be an efficient fabrication method because the footprint of each die package may be made identical, or nearly identical, to the size of the die itself, resulting in very efficient utilization of area on the printed circuit board to which the packaged die is attached.

A common technique for forming electrically conductive connections between a microelectronic chip and one or more other electronic components is through wire-bonding. Conventionally, a wirebonding tool attaches the end of a wire to a pad on a microelectronic chip using thermal and/or ultrasonic energy and then loops the wire to a contact on the other electronic component and forms a second bond thereto using thermal and/or ultrasonic forces.

SUMMARY OF THE INVENTION

As discussed in U.S. application Ser. No. 12/722,784, filed on Mar. 12, 2010 and U.S. application Ser. No. 12/722,799, filed on Mar. 12, 2010, the disclosures of which are incorporated herein by reference, as well as U.S. Application entitled Impedance Controlled Packages With Metal Sheet Or 2-Layer RDL filed by the same assignee herein, on Sep. 16, 2010, the disclosure of which is also incorporated by reference, one of the problems with wire-bond technology is that electromagnetic transmissions along a wire can extend into space surrounding the wire, inducing currents in nearby conductors and causing unwanted radiation and detuning of the line. Wire-bonds generally are also subject to self-inductances and are subject to external noise (e.g. from nearby electronic components). In the end, this creates electrical impedance problems. These problems can become more serious as the pitch between contacts on microelectronic chips and other electronic components becomes smaller, as the chips operate at higher frequencies, and as the use of multiple raw pads becomes more common.

Various structures and techniques for manufacturing are described herein for a microelectronic assembly. A microelectronic assembly may include an interconnection element that may have a plurality of element contacts, a first metal layer that may have a plurality of edges, a second metal layer, a plurality of conductive elements, and a first and second microelectronic device. The first microelectronic device may have a plurality of edges, a rear face adjacent the interconnection element, a front face remote therefrom, and device contacts exposed at the front face of the microelectronic device. The first metal layer may be mounted to the interconnection element with the first microelectronic device positioned therebetween. The first metal layer may extend beyond at least one of the edges of the first microelectronic device. The plurality of conductive elements may extend from at least some of the device contacts of the first microelectronic device beyond at least one edge of the first microelectronic device to at least some of the element contacts. The conductive elements may respectively extend beyond at least one of the edges of the first metal layer. The first metal layer may have a surface disposed at a substantially uniform spacing from at least substantial portions of the conductive elements, such that a desired impedance may be achieved for the conductive elements. The conductive elements may be spaced a smaller distance from the metal layer than the distance of the conductive elements from the front surface of the first microelectronic device. The second microelectronic device may have a surface, a plurality of edges extending away from the surface, and device contacts exposed at the surface. The second microelectronic device may overlie the first metal layer. Finally, the second metal layer may overlie the second microelectronic device and extend beyond at least one of the edges of the second microelectronic device. The second metal layer may be connectable to a source of reference potential.

In a particular embodiment, the conductive elements may extend beyond at least one edge of the plurality of edges of the second metal layer. Alternatively, at least some of the plurality of conductive elements connects the second metal layer to the element contacts on the interconnection element.

In a particular embodiment, the second metal layer may be mounted to the interconnection element. Alternatively, the second metal layer may be mounted to the first metal layer.

In one embodiment, the first metal layer further includes at least one portion extending beyond the at least one edge of the microelectronic device. Alternatively, at least one portion of the first metal layer may overlie at least one of the conductive elements.

In one embodiment, the conductive elements are first conductive elements and the microelectronic assembly further includes second conductive elements extending from at least some of the device contacts of the second microelectronic device beyond at least one edge of the second microelectronic device to at least some of the element contacts.

In one embodiment, the interconnection element further includes a reference contact and the microelectronic assembly further includes a conductive bonding material electrically connecting the first metal layer with the reference contact.

In one embodiment, the interconnection element further includes a reference contact and the microelectronic assembly further includes a bond wire electrically connecting the first metal layer with the reference contact.

In one embodiment, at least one of the first or second metal layers functions as a heat spreader.

In a particular embodiment, the microelectronic assembly further includes a dielectric material at least substantially filling spaces surrounding the conductive elements between the first metal layer and the first microelectronic device.

In another particular embodiment, the substantial portion of each respective conductive element has length of at least 1 millimeter. Alternatively, the substantial portion of each conductive elements has a length of at least 25% of the total length of each respective conductive elements. Alternatively, the second metal layer may be connected to element connects through said first metal layer.

In one embodiment, an electrically conductive adhesive connects the first metal layer with a conductive element of the interconnection element. Alternatively, the conductive adhesive may be thermally conductive or capable of absorbing at least some of the stress caused by thermal expansion mismatch. An electrically conductive adhesive may alternatively connect the second metal with the first metal layer.

Turning to another aspect of the presently disclosed embodiments, a microelectronic assembly includes an interconnection element, first and second microelectronic devices, a plurality of first and second conductive elements, and first and second metal cans. The interconnection element may have a plurality of first element contacts and second element contacts thereon. The first microelectronic device may have a rear face adjacent the interconnection element, a front face remote therefrom, and device contacts exposed at the front face. The microelectronic device may also have a plurality of edges.

The plurality of first conductive elements may extend from at least some of the device contacts of the first microelectronic device beyond at least one edge of the first microelectronic device to at least some of the element contacts. The plurality of first conductive elements may extend beyond at least one of the edges of the first metal layer. A first metal can may be mounted to the interconnection element with the first microelectronic device and the first conductive elements therebetween. The first metal can may have a surface disposed at a substantially uniform spacing from at least substantial portions of the first conductive elements. The conductive elements may be spaced a smaller distance from the metal layer than the distance of the conductive elements from the front surface of the first microelectronic device. The second microelectronic device may have a surface, device contacts exposed at the surface, and may overlie the first metal can. The plurality of second conductive elements may extend from at least some of the device contacts of the second microelectronic device beyond at least one edge of the second microelectronic device to at least some of the second element contacts. The second element contacts may be disposed beyond at least one edge of the first metal can. The second metal can may have a surface disposed at a substantially uniform spacing from at least substantial portions of the second conductive elements. The second metal layer may be connectable to a source of reference potential, such that a desired impedance may be achieved for the first and second conductive elements.

In one embodiment, the substantial portion of each conductive elements has length of at least 1 millimeter. Alternatively, the substantial portion of each conductive element has length of at least 25% of the total length of the conductive element.

In a particular embodiment, the microelectronic assembly further includes a dielectric material at least substantially filling spaces surrounding the first conductive elements between the first metal can and the first microelectronic device and at least substantially surrounding the second conductive elements between the second metal can and the second microelectronic device.

In one embodiment, at least some of the conductive elements extend beyond at least one edge of the plurality of edges of the second metal layer.

In a particular embodiment, the second metal layer may be mounted to the interconnection element. Alternatively, the second metal can may be mounted to the first metal can.

In one embodiment, the first metal can further includes at least one portion extending beyond the at least one edge of the microelectronic device. Alternatively, the at least one portion of the first metal can may overlie at least one of the first conductive elements.

In one embodiment, the interconnection element further includes a reference contact and the microelectronic assembly further includes a conductive bonding material electrically connecting the first metal can with the reference contact. Alternatively, the interconnection element may further include a reference contact and the microelectronic assembly may further include a bond wire that electrically connects the first metal can with the reference contact.

In a particular embodiment, a bond wire electrically connects the first and second metal cans.

In a particular embodiment, at least one of the first or second metal cans functions as a heat spreader.

In one embodiment, a dielectric material may at least substantially fill spaces surrounding the conductive elements between the first metal can and the first microelectronic device.

In one embodiment, the second metal layer is connected to element connects through the first metal layer.

In one embodiment, at least some of the plurality of conductive elements connects the second metal layer to the element contacts on the interconnection element.

In one embodiment, an electrically conductive adhesive may connect the first metal layer with a conductive element of the interconnection element. The adhesive may be thermally conductive or capable of absorbing at least some of the stress caused by thermal expansion mismatch.

In a particular embodiment, the microelectronic assembly further includes an electrically conductive adhesive connecting the second metal with the first metal layer.

Turning now to another aspect of the presently disclosed embodiments, a method of manufacturing a microelectronic assembly includes providing a first microelectronic assembly that includes an interconnection element, a first microelectronic device mounted thereto, and a plurality of conductive elements extending between device contacts thereof and at least some first element contacts of the interconnection element. Additional structures may be formed, including a first metal layer overlying the first microelectronic assembly. The first metal layer may have a surface disposed at a substantially uniform spacing from at least substantial portions of the first conductive elements. A second microelectronic device may further overlie the first metal layer. The second microelectronic device may have a surface and device contacts exposed at its surface. Second conductive elements may also extend between the device contacts of the second microelectronic device and at least some second element contacts of the interconnection element. The second metal layer may be mounted above the second microelectronic device. The second metal layer may have a surface disposed at a substantially uniform spacing from at least substantial portions of the second conductive elements, such that a desired impedance is achieved for the first and second conductive elements. At least some of the first conductive elements may extend beyond at least one edge of the first metal layer to the first element contacts.

In one embodiment of the method, the second element contacts may be disposed beyond at least one edge of the first metal layer. A plurality of second conductive elements may extend between the device contacts and at least some of the first element contacts. The second conductive elements may also extend beyond at least one edge of the second microelectronic device to at least some of the second element contacts.

Turning to another aspect of the presently disclosed embodiments, a microelectronic assembly includes an interconnection element, a microelectronic device. The interconnection element may have a face and a plurality of element contacts and reference contacts exposed at the face. The microelectronic device may have a rear surface that overlies the face of the interconnection element and a front surface that has first and second device contacts exposed at the front surface. A plurality of first conductive elements may connect the first device contacts with the element contacts. The conductive elements may have first lengths, and at least substantial portions of the first lengths extending a first height above the surface of the microelectronic device. A plurality of second conductive elements may connect the second device contacts with the reference contacts. The second conductive elements may have second lengths, and at least substantial portions of the second lengths may extend a second height above the surface of the microelectronic device. The second height may be greater than the first height. The first height may be greater than the difference between the first and second heights, such that a desired impedance may be achieved for the first conductive elements. A conductive plane may be attached at least a substantially uniform distance above the at least substantial portions of the first lengths of the first conductive elements. The conductive plane may be electrically connected to the second conductive elements and may also be connectable to a source of reference potential. The conductive plane may extend at least substantially parallel to a plane in which the first conductive elements run.

In one embodiment, the substantial portion of each first conductive element has length of at least 1 millimeter. Alternatively, the substantial portion of each first conductive element has length of at least 25% of the total length of the first conductive elements.

In one embodiment, the conductive plane directly contacts the second conductive elements. Alternatively, the conductive plane may be separated from the plurality of first conductive elements by insulating material. In still another embodiment, the conductive plane may be separated from the microelectronic device by an insulating material.

In one embodiment, the microelectronic assembly further includes a conductive bonding material electrically connecting the conductive plane with the second conductive elements.

In one embodiment, the conductive plane may function as a heat spreader. Alternatively, the conductive plane may mechanically support a second microelectronic device mounted above the conductive plane. In another alternative embodiment of the conductive plane, the conductive plane may overlie a plurality of the runs of the first conductive elements. Finally, in another alternative embodiment, the conductive plane may be at least generally planar.

In a particular embodiment, the second conductive elements may extend along a surface of the insulating material.

In one embodiment, the first and second conductive elements include bond wires. Alternatively, the first and second conductive elements may be bond wires.

In a particular embodiment, the interconnection element includes a dielectric element. Alternatively, the interconnection element may include a reference contact connectable to the source of reference potential and the conductive material may be conductively connected with the reference contact.

In one embodiment, the insulating material at least substantially fills a volume and the plurality of first conductive elements extends through the volume.

In another aspect of the presently disclosed embodiment, a microelectronic assembly includes an interconnection element, a microelectronic device, a plurality of first and second conductive elements. The interconnection element may have a plurality of element contacts and reference contacts. The microelectronic device may have a rear surface mounted to the interconnection element and a front surface may have first and second device contacts exposed at the front surface. The plurality of first conductive elements may connect first device contacts with the element contacts. The conductive elements may have runs extending above the surface of the microelectronic device and the first conductive elements may be insulatively sheathed. The plurality of second conductive elements may connect second device contacts with the reference contacts and may have runs adjacent the runs of the first conductive elements. The conductive plane may be disposed at least a substantially uniform distance above at least substantial portions of the lengths of the first conductive elements. The conductive plane may further be connectable to a source of reference potential and extend at least substantially parallel to a plane in which the first conductive elements run. A conductive adhesive may electrically connect the conductive plane with the second conductive elements, such that a desired impedance may be achieved for the first conductive elements.

In one embodiment, the substantial portion of the first conductive elements or second conductive elements has length of at least 1 millimeter. Alternatively, the substantial portion of the first conductive elements or second conductive elements has length of at least 25% of the total length of the first conductive elements.

In one embodiment, the conductive plane directly contacts the second conductive elements. Alternatively, the conductive plane may be separated from the plurality of first conductive elements by insulating material. In still another embodiment, the conductive plane may be separated from the microelectronic device by an insulating material.

In one embodiment, the microelectronic assembly further includes a conductive bonding material electrically connecting the conductive plane with the second conductive elements.

In one embodiment, the conductive plane may function as a heat spreader. Alternatively, the conductive plane may mechanically support a second microelectronic device mounted above the conductive plane. In another alternative embodiment of the conductive plane, the conductive plane may overlie a plurality of the runs of the first conductive elements. Finally, in another alternative embodiment, the conductive plane may be at least generally planar.

In a particular embodiment, the second conductive elements may extend along a surface of the insulating material.

In one embodiment, the first and second conductive elements include bond wires. Alternatively, the first and second conductive elements may be bond wires.

In a particular embodiment, the interconnection element includes a dielectric element. Alternatively, the interconnection element may include a reference contact connectable to the source of reference potential and the conductive material may be conductively connected with the reference contact.

In one embodiment, the insulating material at least substantially fills a volume and the plurality of first conductive elements extends through the volume.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIG. 1D is a diagram graphing characteristic impedance $Z_0$ relative to separation height H for different diameters of bond wire, in accordance with an embodiment.

DETAILED DESCRIPTION

Figure 1:
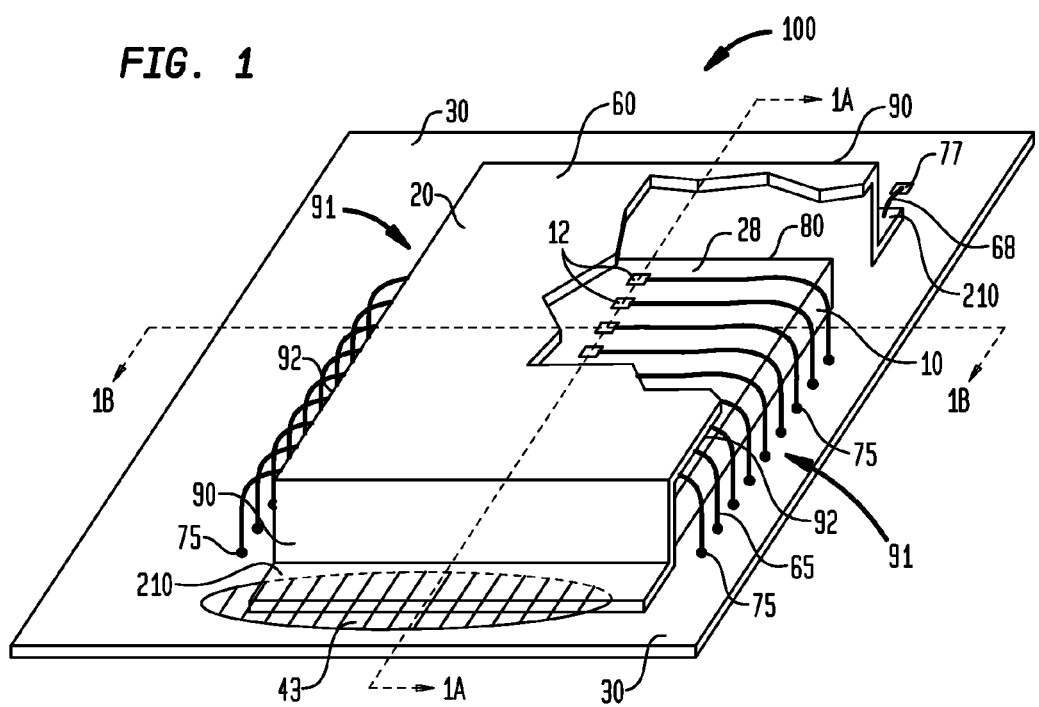
FIG. 1 is a perspective view of a microelectronic assembly in accordance with an embodiment of the invention.

FIG. 1 is a perspective view of an exemplary microelectronic assembly 100 that includes a microelectronic device 10, a conductive layer such as a metal sheet or can and an interconnection element 30 connected therewith.

Figure 1A:
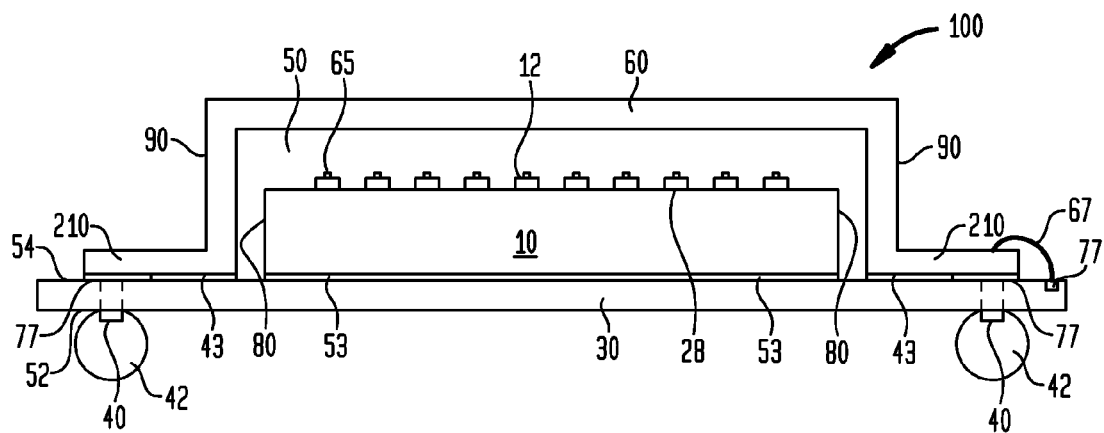
FIG. 1A is a sectional view taken along line 1A-1A of FIG. 1.
Figure 1B:
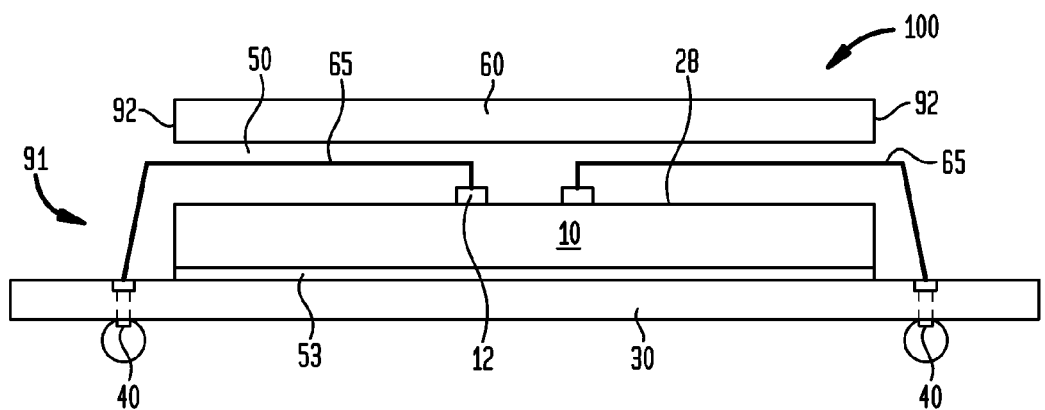
FIG. 1B is a sectional view taken along line 1B-1B of FIG. 1.
Figure 1C:
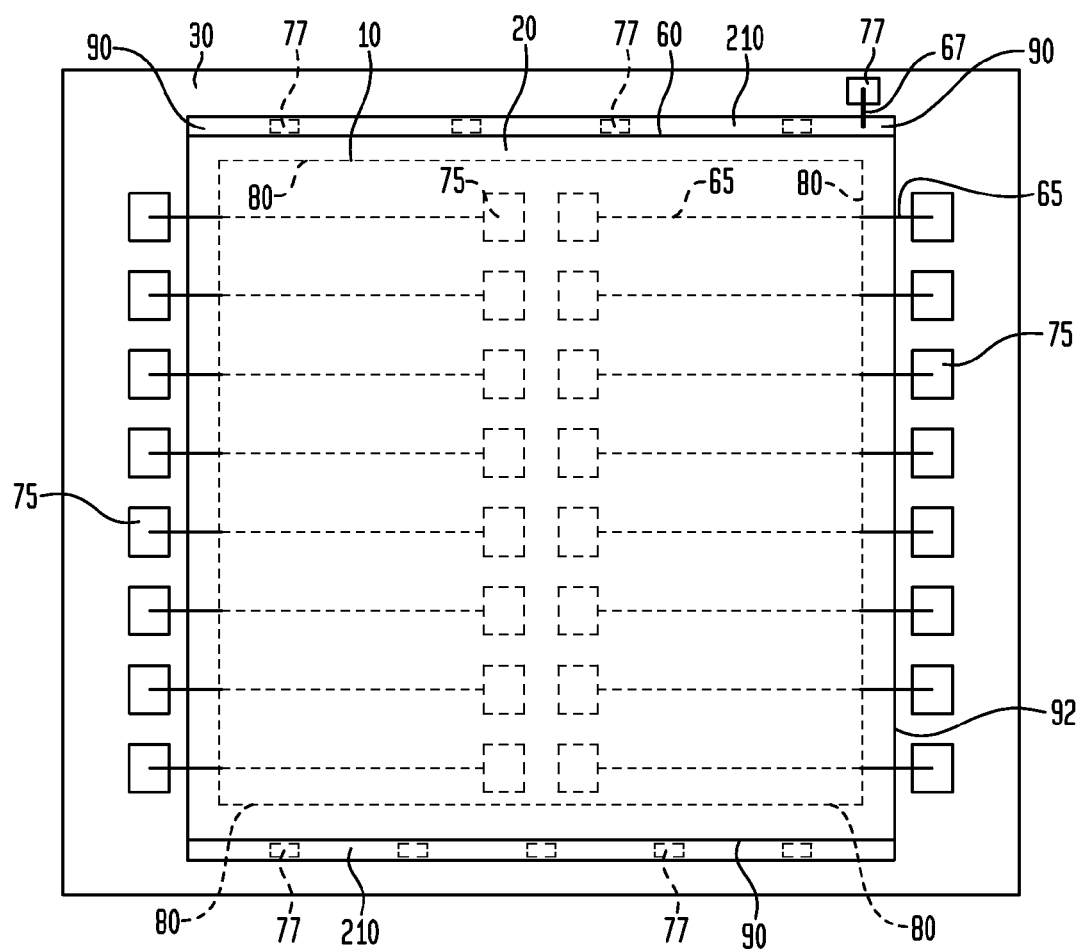
FIG. 1C is a plan view of the microelectronic assembly shown in FIG. 1.

FIG. 1A is a sectional view taken along line 1A-1A of FIG. 1 and FIG. 1B is a sectional view taken along line 1B-1B of FIG. 1. FIG. 1C is a top view of the microelectronic assembly 100 looking down toward the top surface 20 of the conductive layer, e.g., metal can 60.

In this embodiment, microelectronic assembly 100 includes a microelectronic device 10 bonded to the interconnection element 30 using known methods of attachment, such as a dielectric adhesive 53. Microelectronic device 10 can be a single "bare", i.e., unpackaged die, e.g., a semiconductor chip having microelectronic circuitry thereon. In alternative embodiments, microelectronic device 10 can include a packaged semiconductor die. Initially, a plurality of contacts 12 are exposed at a surface 28 of the microelectronic device 10. For example, a plurality of contacts 12 can be exposed at a contact-bearing surface of a semiconductor die and may be arranged in one or more rows exposed at such surface. The microelectronic device 10 is conductively connected to interconnection element 30 through a plurality of device bond wires 65 extending from the contacts 12 on the microelectronic device 10 to signal or device contacts 75 on the interconnection element 30.

For ease of reference, directions are stated in this disclosure with reference to a "top", i.e., contact-bearing surface 28 of a semiconductor chip 10. Generally, directions referred to as "upward" or "rising from" shall refer to the direction orthogonal and away from the chip top surface 28. Directions referred to as "downward" shall refer to the directions orthogonal to the chip top surface 28 and opposite the upward direction. A "vertical" direction shall refer to a direction orthogonal to the chip top surface. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction. It is to be further appreciated that like reference numerals will be used to describe like elements.

As best seen in FIGS. 1 and 1A, a conductive or metal "can" 60 overlies the microelectronic device 10. The conductive can 60 has feet 210 (FIGS. 1, 1A) at a first set of opposed ends 90 that are directly bonded to reference contacts 77 on the interconnection element 30 using a conductive adhesive 43. (FIGS. 1A,1C.) The feet 210 of the conductive can 60 can also or alternatively be connected to the reference contacts 77 via a wirebond 67, as shown in FIGS. 1 and 1C. The other or second pair of opposed ends 92 of the conductive can 60 are not bonded to the interconnection element 30, so that an opening 91 extending through the second pair of opposed ends 92 is created.

The conductive can 60 may be formed from a conductive material, such as copper or other suitable metals. In one embodiment, the conductive can 60 is a continuous rigid metal sheet of copper that can be shaped to form a box-like structure that covers substantial portions of the underlying microelectronic device 10. The conductive can 60 may be formed using known methods, such as press forming or the like. In the embodiment shown in FIGS. 1-1C, the conductive can 60 is shaped so that the opposed ends 90 connected to the interconnection element extend just beyond one set of opposed edges 80 of the microelectronic device 10. The conductive can 60 can also serve as a mechanical support for other microelectronic devices to be stacked thereon.

A plurality of device wires 65 such as bond wires extends from the contacts 12 on the microelectronic device to the device contacts 75 on the interconnection element 30. As best seen in FIG. 1, the opening 91 in the conductive can 60 allows the plurality of device wires 65 to extend beyond at least one of the outer edges 92 of the conductive can. The wires 65 typically are not insulated. As seen in FIG. 1, typically such wires 65 are bonded to microelectronic device 10 and to interconnection element 30 using conventional wire-bonding techniques. In one embodiment, wires 65 may be typical of the types of wires used in a conventional wire-bonding process. For example, wires 65 may consist essentially of copper, gold, a gold-silver alloy, or some other metal or alloy of a metal with one or more other metals or materials or an alloy of a metal with one or more other metals and one or more other materials.

Wirebonds can be formed with relatively precise placement and within desirable tolerances such that parallel, closely spaced runs can be achieved which run parallel to the surface 28 of the conductive plane 60. As used herein, "parallel" denotes a structure which is parallel to another structure within manufacturing tolerances. For example, wirebonding equipment available from Kulicke and Soffa (hereinafter, "K&S") can be used to achieve precision wirebonds. Thus, device wires 65 can be formed which have runs which are perfectly straight in lateral directions above the chip surface 28 and conductive plane 60 or are close to being straight.

While such precision can be achieved in forming the wirebonds, nothing is meant to require precisely formed parallel, straight wirebonds other than as specifically recited in the appended claims.

Referring to FIGS. 1 and 1B, the device wires 65 have runs which are raised above the surface 28 of the microelectronic device 20, but below the conductive can 60. In one embodiment, the device wires 65 are spaced a smaller distance from the conductive can 60 than the distance of the device wires 65 from the top surface 28 of the microelectronic device. (See FIG. 1B.) The runs of the device wires 65 can extend in a horizontal direction parallel to or at least generally parallel to the surface of the conductive plane 60, as shown in FIG. 1. In this case, the runs may be parallel within manufacturing tolerances therefor.

In one embodiment, the conductive can 60 and wires 65 can be positioned relative to one another such that a substantial portion of the wire 65, for example, 25% or more of the total lengths or runs of the wires 65, or 1 millimeter of the length of the wires 65, can be disposed at a substantially uniform distance from the conductive can 60, e.g., typically a distance of about 50 micrometers from the conductive can to about 100 micrometers from the conductive can 60. In such way, signals to and from the microelectronic device 10 may be transmitted with less noise entering the connections (e.g., wirebonds) carrying the signals. Each wire 65 being tied to a source of reference voltage, forms a transmission line structure that has a desired characteristic impedance.

In order to achieve a desired characteristic impedance, parameters can be selected such as the conductive properties of the metal used in the wire, as well as the shape and thickness of the wire, the thickness of the insulating material 50 between the wire and the conductive can 60, the dielectric constant of the insulating material, i.e., permeability.

FIG. 1D graphs characteristic impedance $Z_0$, in ohms, versus separation distance, in inches, between a signal conductor or conductive element, e.g., a wire of cylindrical cross-section or a trace, and a reference conductor or conductive element, e.g., "ground plane". The reference conductor is assumed to be a planar structure that is large in comparison with the diameter of the signal conductor. FIG. 1C plots characteristic impedance for two different diameter wires. The plots in FIG. 1B can be derived from an equation that governs characteristic impedance in an arrangement having the present geometry. In such equation, the characteristic impedance $Z_0$ is given by $$Z_0 = \frac{138 \times \log(4H/d)}{\sqrt{\varepsilon_R}} \text{ ohms,}$$

where H is the separation distance between the wire and the conductive plane, d is the diameter of the wire and $\varepsilon_R$ is the permeability of the dielectric material that separates the wire from the conductive plane. The permeability $\varepsilon_R$ can vary depending on the type of dielectric material used. The separation distance H is a factor which can be at least partly determined by the process used to fabricate the microelectronic assembly. The wire diameter may be at least partly determined by the process used to fabricate the microelectronic assembly.

In FIG. 1D, the lower curve 320 plots the characteristic impedance when the wire used to form a wirebond has a thickness of 1 mil, i.e., 0.001 inch. The upper curve plots 322 the characteristic impedance when the wire used to form the wirebond has a thickness of 0.7 mil, i.e., 0.0007 inch. As seen in FIG. 1D, characteristic impedances lower than about 70 ohms are provided when a separation distance H between the wire and the conductive plane is less than or equal to about 0.002 inch (2 mils), i.e., about 50 microns.

Terminals 40 on the interconnection element 30 can be used to connect the microelectronic assembly 100 with a circuit board or other external device (not shown), such as through solder balls 42, which can be attached to the terminals 40 and extend away from a surface 54 of the interconnection element 30 remote from a surface 52 above which microelectronic device 10 is mounted. Terminals can be provided which have other forms than that depicted in FIGS. 1A-1B, and can be or include, for example, substantially rigid conductive posts such as formed by etching or plating a metal layer, e.g., copper, or a combination of etching and plating steps. Alternatively, the terminals can be in form of any other known terminal structures which are capable of being used in microelectronic packages or assemblies for electrically connecting such packages or assemblies to a circuit panel, test board or the like.

Figure 2:
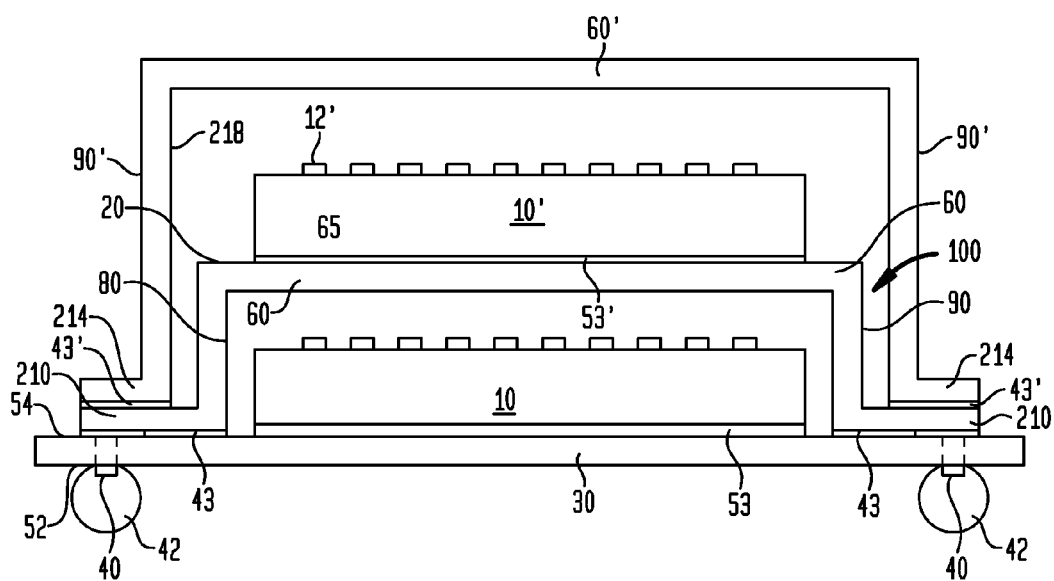
FIG. 2 is a microelectronic assembly in accordance with an alternative embodiment of FIGS. 1 and 1A.
Figure 2A:
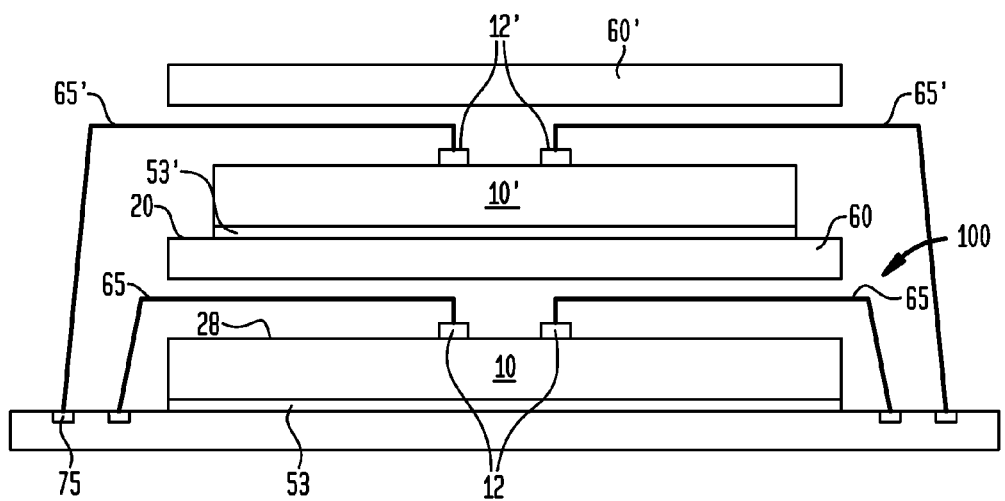
FIG. 2A is a microelectronic assembly in accordance with an alternate embodiment of FIGS. 1 and 1B.

Referring now to the sectional views shown in FIGS. 2 and 2A, a stacked arrangement of the microelectronic assembly 100 in FIGS. 1A-1C is shown. In this embodiment, another microelectronic element 10' with central contacts 12' exposed thereat and another conductive can 60' is added to the microelectronic assembly 100 shown in FIGS. 1A-1C. As shown, a second microelectronic device 10' may be directly mounted to the top surface 20 of the first conductive can 60 using known methods of bonding, such as a dielectric adhesive 53'. In such arrangement, the first conductive can 60 provides the additional function of providing a mechanical support for the second microelectronic device 10'.

The second conductive can 60' overlies the second microelectronic device 10', as well as the first microelectronic device 10 and the first conductive can 60. The second conductive can 60' is formed in a shape similar to the first conductive can 60. Two ends of the second conductive can 60' extend beyond the edges of the first microelectronic device 10 and second microelectronic device 10', as well as downward toward the interconnection element 30. The feet 214 of the second conductive can 60' may be positioned directly on top of the feet 210 of the first conductive can 60 and conductively bonded to the feet 210 of the first conductive can using any type of known conductive materials, such as a conductive adhesive 43', for example, a conductive paste such as a metal or solder-filled epoxy. As best seen in FIG. 2, the second conductive can 60 may be positioned so that there is a gap 219 between the inner surface 218 of the second conductive can 60' and the outer surface 220 of the first conductive can 60.

In one embodiment, the second conductive can 60' only has two opposed ends 90' directly connected with the interconnection element 30 and the other opposed ends 92 of the conductive can 60' are open and spaced apart from the interconnection element 30 to allow for wire bonds 65' to extend therethrough. As best seen in 2A, wires 65' extend through the opposed ends 92 to connect the contacts 12' on the second microelectronic device 10' with device contacts on the interconnection element 30. As in the lower assembly 100, substantial lengths of the signal wires 65' (e.g., 25% of the length or at least 1 millimeter of length of an individual signal wire 65') extend substantially parallel to the conductive can 60' and maintain a substantially constant distance from the conductive can 60'. This allow for a desired impedance to be attained.

Figure 3:
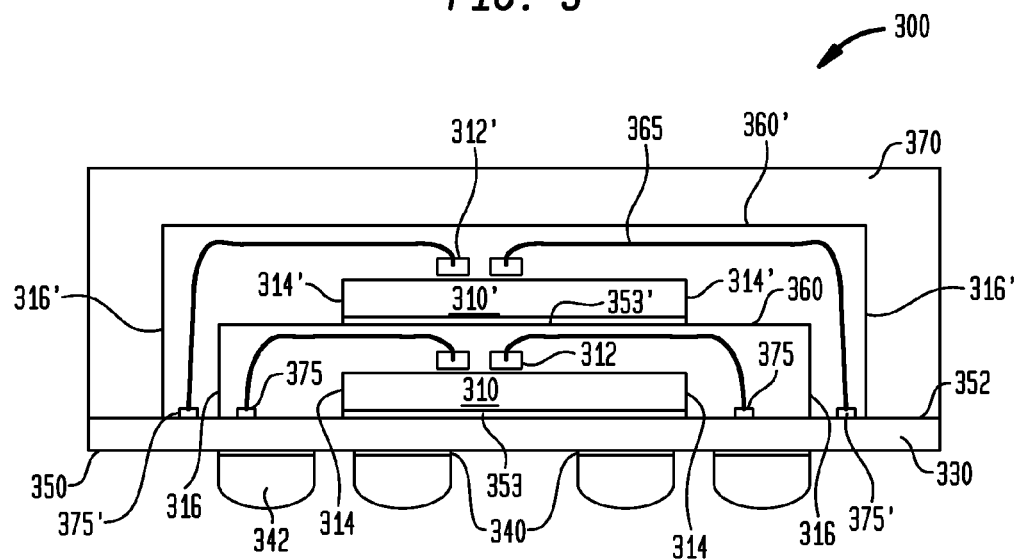
FIG. 3 is a sectional view of a microelectronic assembly in accordance with an alternate embodiment of FIG. 2.
Figure 3A:
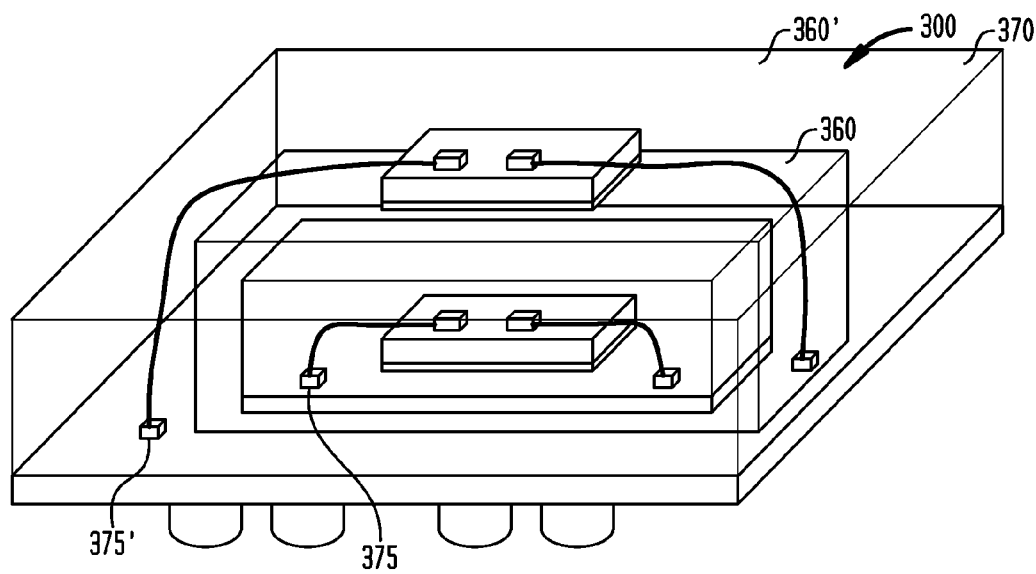
FIG. 3A is a perspective view of the microelectronic assembly shown in FIG. 3.

Referring now to FIGS. 3 and 3A, a representation of another alternate arrangement of FIGS. 2 and 2A is shown. This embodiment is similar to the stacked arrangement in FIGS. 2-2A except that the inner can 360 has walls 316 adjacent to edges 314 of microelectronic device 310, such that the wire bonds 365 connect to contacts 375 on the interconnection element 330 at locations between the edges 314 and the walls 316. Similarly, the outer can 360' has walls 316' adjacent to edges 314' of the second microelectronic device 310', such that the wire bonds 365' connect to contacts 375' on the interconnection element 330 at locations between the edges 314' of the second microelectronic device 310' and the walls 316' of the outer can. In a particular embodiment, all or substantially all of the wires 365 extending from the contacts 312 on the lower microelectronic device 10 to the device contacts 375 on the interconnection element 330 are contained within the lower conductive can 360. Similarly, all or substantially all of the conductive wires 365' extending from the contacts 312 on the second microelectronic device 310' to the device contacts 375' on the interconnection element 330 can be contained within the lower conductive can 360.

In one embodiment, the device contacts 375 which electrically connect the second microelectronic device 310' to the interconnection element are positioned between the inner can 360 and outer can 360'. The device contacts 375 which provide a connection to the interconnection element from the lower microelectronic device 310 are positioned adjacent the microelectronic device and the first conductive can 360.

As with respect to the previous embodiment, substantial portions of the wires 365' extending from the second microelectronic device 310' to the device contacts 375 on the interconnection element 330 extend parallel to the conductive can 360'. The wires 365' may be spaced a substantially constant distance from the conductive can 360' so as to allow for desired impedance. Additionally, the second microelectronic device 310' may be attached to the first metal can 360 by means of a conductive adhesive 353'.

An encapsulant 370 can be placed around the outer portions of the conductive can 360' to complete the microelectronic assembly 300. Terminals 340 of the assembly 300 may be used to connect the microelectronic assembly 300 to a circuit board or external device (not shown), such as through solder balls 342, which can be attached to the terminals 340 and extend away from a surface 350 of the interconnection element 330 remote from a surface 352 above which microelectronic device 310 is mounted. Terminals can be provided which have other forms than that depicted in FIGS. 3-3A, and can be or include, for example, substantially rigid conductive posts such as formed by etching or plating a metal layer, e.g., copper, or a combination of etching and plating steps. Alternatively, the terminals can be in form of any other known terminal structures which are capable of being used in microelectronic packages or assemblies for electrically connecting such packages or assemblies to a circuit panel, test board or the like.

Figure 4:
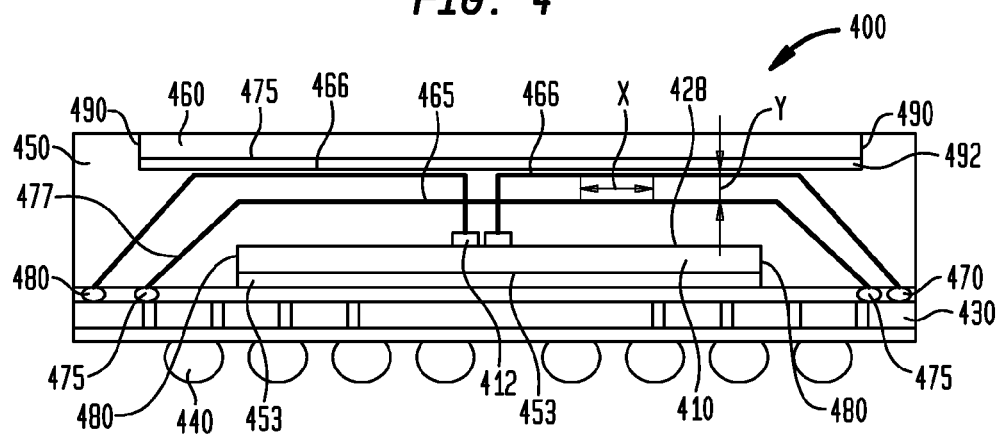
FIG. 4 is a sectional view of a microelectronic assembly in accordance with another embodiment of the invention.
Figure 4C:
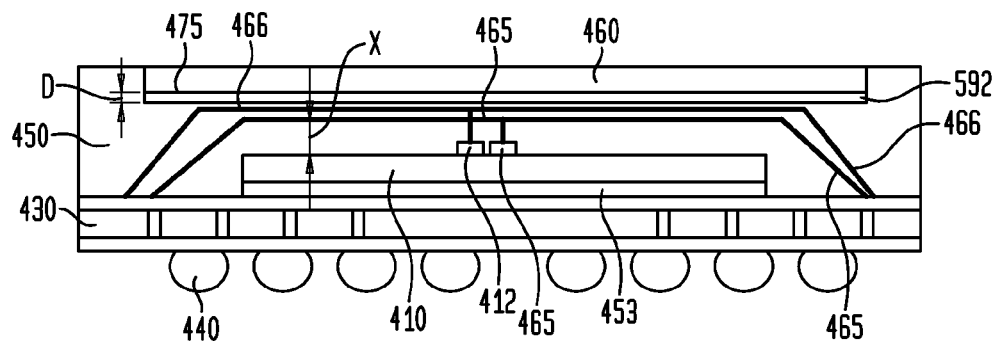
FIG. 4C is a sectional view of a microelectronic assembly in accordance with an alternative embodiment of FIG. 4.
Figure 4A:
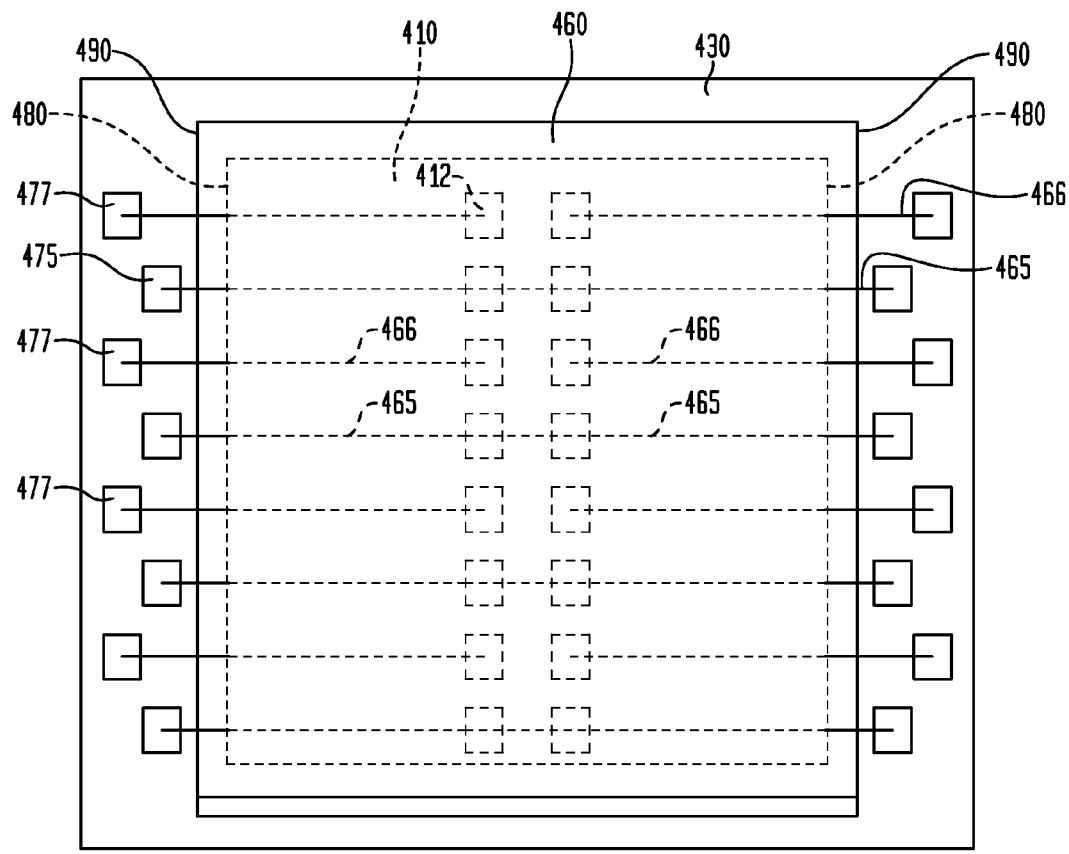
FIG. 4A is a plan view of the microelectronic assembly shown in FIG. 4.
Figure 4B:
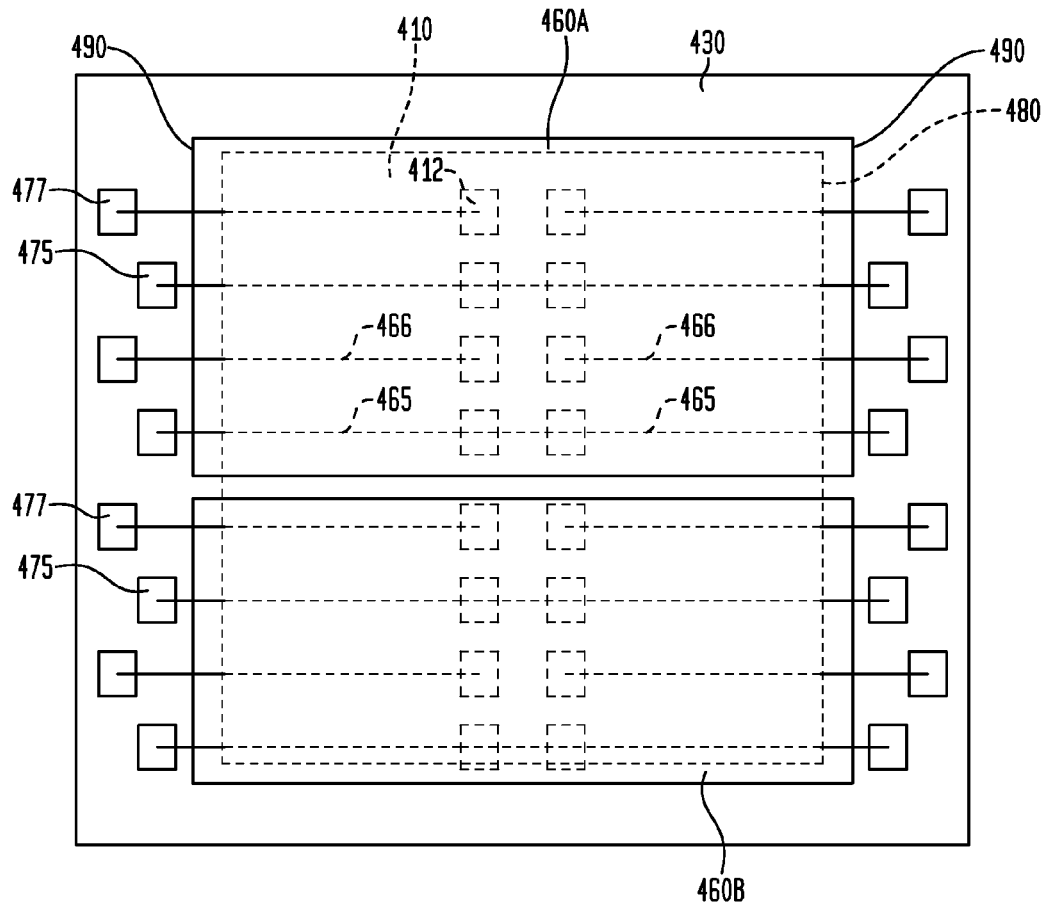
FIG. 4B is a plan view of a microelectronic assembly in accordance with an alternate embodiment of FIGS. 4 and 4A.

Referring now to FIGS. 4A-4B, there is shown an alternative assembly 400 which represents a variation from the assemblies shown in FIGS. 1-3. FIG. 4 is a sectional view of a microelectronic assembly and FIG. 4A is a top plan view of the microelectronic assembly shown in FIG. 4. In this embodiment, the microelectronic assembly 400 includes an interconnection element 430, a conductive plane 460, and a microelectronic device 410 bonded to the interconnection element 430 by any known means, such as a dielectric adhesive 453.

In one embodiment, the conductive plane 460 is a continuous plane that overlies the microelectronic device 410. The conductive plane 460 may be comprised of known conductive materials, such as copper, gold, or other conductive metals. As shown, outer opposed edges 490 of the conductive plane 460 can extend beyond outer opposed edges 480 of the microelectronic device 410. The conductive plane 460 is electrically connected to the interconnection element 430 and microelectronic device 410 via a first set of wires 465, as discussed herein.

In one embodiment, wire 465 is a signal wire (e.g. used to transfer signals between interconnection element 430 and microelectronic device 410) and the other wire 466 is a ground or power wire, i.e., a wire that is bonded to a ground or power contact of the interconnection element 477.

In one embodiment, a substantial lengths X of signal wires 465 (e.g., 25% or more of the total length or 1 millimeter of the length of the signal wire 465) extend parallel to the surface of the conductive plane 460. The wires 465 are also positioned a substantially constant distance Y from the lower surface of the conductive plane 460. The signal wires 465 connect contacts 12 on the microelectronic device 10 with signal contacts on the interconnection element 430.

Substantial lengths of reference wires 466 extend directly below and parallel to the surface of the conductive layer 460. In one embodiment, a conductive material, such as a conductive adhesive 492 may be used to connect the conductive plane 460 to the substantial runs of the wires 466. The reference wires 466 can connect contacts 12 on the microelectronic device 10 with reference contacts on the interconnection element 430. Alternatively, the reference wires 466 may connect contacts 12 on the microelectronic device to the conductive plane 460.

As shown in FIG. 4A, the wires 466 may be formed such that they extend to a higher location above the contact-bearing surface 428 of microelectronic device 410 than signal wires 465. In such embodiment, the height of the wires 466 above the microelectronic device may be greater than the difference in height between the height of the reference wires 466 above the microelectronic device and the height of the signal wires extending above the contact-bearing surface 428 of the microelectronic device. Because the wires 466 extend to a higher location, when dielectric material 450 is provided over wires 465 and 466, wire 466 is not completely covered by the dielectric material 450. The conductive layer 460 contacts the wire 466 and forms an electrically conductive connection with the wire. The wire 466 may be connected to respective reference contacts 477 (e.g., ground contacts or voltage supply contacts) on the microelectronic device 410 and the interconnection element 430.

As further seen in FIG. 4A, the conductive layer 460 is connected to a reference contact 480 (e.g., a ground or power contact pad) of the interconnection element by the reference wires 466. In such way, the conductive layer 460 can act as a reference conductor for a transmission line that includes the signal wire 465 and the reference wire 466 and may also include the conductive layer 460 as a part of the transmission line. Because at least one of the reference wires 466 is also connected to a contact 412 on the microelectronic device 410, the transmission line formed by the signal and reference wires 465, 466 extends to the contacts on the microelectronic device 410.

FIG. 4B is another alternate embodiment of the microelectronic assembly shown in FIG. 4A. The assembly is virtually identical, except for the fact that the conductive layer is comprised of a first continuous planar sheet 460A and a second continuous planar sheet 460B, instead of one continuous layer sheet. In one embodiment, the first continuous planar sheet 460A may be a ground conductive plane and the second continuous planar sheet 460B may be a power conductive plane. In this embodiment, the ground wires 466 and ground contacts 477 would be electrically connected to the first continuous planar sheet 460A through the conductive adhesive 492. And the power wires 465 and power contacts 475 would be located adjacent to the second continuous planar sheet 460B.

FIG. 4C is a sectional view illustrating a variation of the embodiment shown in FIGS. 4A-B. In this embodiment, the reference wires 476 do not extend to a higher location above the surface 428 of the microelectronic device than a signal wire 475, as in FIGS. 4A-B. Here, the reference wire 476 and signal wire 475 both extend the same height or distance X above the surface 428 of the microelectronic device. Substantial lengths (e.g., 25% or more or 1 millimeter or more) of the signal wire 475 also both extend a substantially constant distance Y away from the lower surface 475 of the conductive layer 460.

In one embodiment, a conductive material 592, such as a conductive adhesive may be used to connect the conductive layer 460 to the substantial runs of the wires 466. The thickness of the conductive material 592 can be used to maintain the wires 466 at a constant separation distance D (FIG. 4C) away from the conductive layer 460. The signal wire 465 may also be insulatively sheathed so as to prevent any electrical connection between the signal wire 475 and the conductive layer 460.

Figure 5:
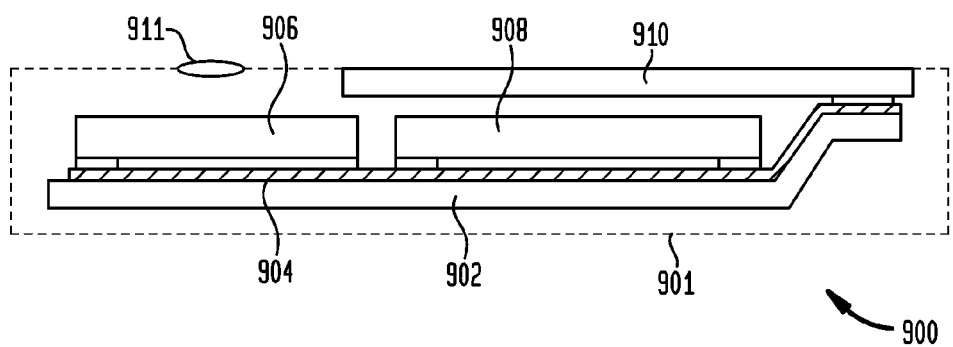
FIG. 5 is a schematic depiction of a system according to one embodiment of the invention.

The various microelectronic assemblies discussed above can be utilized in construction of diverse electronic systems. For example, a system 900 in accordance with a further embodiment of the invention includes a structure 906 as described in the prior embodiments of microelectronic assemblies above in conjunction with other electronic components 908 and 910. In the example depicted, component 908 is a semiconductor chip whereas component 910 is a display screen, but any other components can be used. Of course, although only two additional components are depicted in FIG. 5 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 5, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 5 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
an interconnection element having a plurality of element contacts;
a first microelectronic device having a rear face adjacent the interconnection element, a front face remote therefrom, and device contacts exposed at the front face, the first microelectronic device having a plurality of edges;
a first metal layer mounted to the interconnection element with the first microelectronic device therebetween, the first metal layer having a plurality of edges, the first metal layer extending beyond at least one of the edges of the first microelectronic device;
a plurality of conductive elements extending from at least some of the device contacts of the first microelectronic device beyond at least one edge of the first microelectronic device to at least some of the element contacts, the conductive elements respectively extending beyond at least one of the edges of the first metal layer, the first metal layer having a surface disposed at a substantially uniform spacing from at least substantial portions of the conductive elements, such that a desired impedance is achieved for the conductive elements, the conductive elements spaced a smaller distance from the metal layer than the distance of the conductive elements from the front surface of the first microelectronic device;
a second microelectronic device having a surface, a plurality of edges extending away from the surface, and device contacts exposed at the surface, the second microelectronic device overlying the first metal layer; and
a second metal layer overlying the second microelectronic device, the second metal layer extending beyond at least one of the edges of the second microelectronic device, wherein the second metal layer is connectable to a source of reference potential.

2. The microelectronic assembly as claimed in claim 1, wherein the conductive elements extend beyond at least one edge of the plurality of edges of the second metal layer.

3. The microelectronic assembly as claimed in claim 1, wherein the second metal layer is mounted to the interconnection element.

4. The microelectronic assembly as claimed in claim 1, wherein the second metal layer is mounted to the first metal layer.

5. The microelectronic assembly as claimed in claim 1, wherein the first metal layer further includes at least one portion extending beyond the at least one edge of the microelectronic device.

6. The microelectronic assembly as claimed in claim 1, wherein at least one portion of the first metal layer overlies at least one of the conductive elements.

7. The microelectronic assembly as claimed in claim 1, wherein the conductive elements are first conductive elements, the microelectronic assembly further comprising second conductive elements extending from at least some of the device contacts of the second microelectronic device beyond at least one edge of the second microelectronic device to at least some of the element contacts.

8. The microelectronic assembly as claimed in claim 1, wherein the interconnection element further includes a reference contact, the microelectronic assembly further comprising a conductive bonding material electrically connecting the first metal layer with the reference contact.

9. The microelectronic assembly as claimed in claim 1, wherein the interconnection element further includes a reference contact, the microelectronic assembly further comprising a bond wire electrically connecting the first metal layer with the reference contact.

10. The microelectronic assembly as claimed in claim 1, wherein at least one of the first or second metal layers functions as a heat spreader.

11. The microelectronic assembly as claimed in claim 1, further comprising a dielectric material at least substantially filling spaces surrounding the conductive elements between the first metal layer and the first microelectronic device.

12. The microelectronic assembly, as claimed in claim 1, wherein the substantial portion of the conductive elements has length of at least 1 millimeter.

13. The microelectronic assembly, as claimed in claim 1, wherein the substantial portion of each conductive element has a length of at least 25% of the total length of each individual conductive element.

14. The microelectronic assembly as claimed in claim 1, wherein the second metal layer is connected to element connects through said first metal layer.

15. The microelectronic assembly as claimed in claim 1, wherein at least some of the plurality of conductive elements connect the second metal layer to the element contacts on the interconnection element.

16. The microelectronic assembly as claimed in claim 1, further comprising an electrically conductive adhesive connecting the first metal layer with a conductive element of the interconnection element.

17. The microelectronic assembly as claimed in claim 16, wherein the adhesive is thermally conductive.

18. The microelectronic assembly as claimed in claim 16, wherein the adhesive is capable of absorbing at least some of the stress caused by thermal expansion mismatch.

19. The microelectronic assembly as claimed in claim 16, further comprising an electrically conductive adhesive connecting the second metal with the first metal layer.

20. A microelectronic assembly comprising:
an interconnection element having a plurality of first element contacts and second element contacts thereon;
a first microelectronic device having a rear face adjacent the interconnection element, a front face remote therefrom, and device contacts exposed at the front face, the microelectronic device having a plurality of edges;
a plurality of first conductive elements extending from at least some of the device contacts of the first microelectronic device beyond at least one edge of the first microelectronic device to at least some of the element contacts, the plurality of first conductive elements extending beyond at least one of the edges of the first metal layer;
a first metal can mounted to the interconnection element with the first microelectronic device and the first conductive elements therebetween, the first metal can having a surface disposed at a substantially uniform spacing from at least substantial portions of the first conductive elements, the conductive elements spaced a smaller distance from the metal layer than the distance of the conductive elements from the front surface of the first microelectronic device;
a second microelectronic device having a surface and device contacts exposed at the surface, the second microelectronic device overlying the first metal can;
a plurality of second conductive elements extending from at least some of the device contacts of the second microelectronic device beyond at least one edge of the second microelectronic device to at least some of the second element contacts, the second element contacts disposed beyond at least one edge of the first metal can, the second metal can having a surface disposed at a substantially uniform spacing from at least substantial portions of the second conductive elements,
wherein the second metal layer is connectable to a source of reference potential, such that a desired impedance is achieved for the first and second conductive elements.

21. The microelectronic assembly, as claimed in claim 20, wherein the substantial portion of the conductive elements has length of at least 1 millimeter.

22. The microelectronic assembly, as claimed in claim 18, wherein the substantial portion of each conductive element has length of at least 25% of the total length of each individual conductive element.

23. A microelectronic assembly as claimed in claim 20, further comprising a dielectric material at least substantially filling spaces surrounding the first conductive elements between the first metal can and the first microelectronic device and at least substantially surrounding the second conductive elements between the second metal can and the second microelectronic device.

24. A microelectronic assembly as claimed in claim 20, wherein at least some of the conductive elements extend beyond at least one edge of the plurality of edges of the second metal layer.

25. A microelectronic assembly as claimed in claim 20, wherein the second metal layer is mounted to the interconnection element.

26. A microelectronic assembly as claimed in claim 20, wherein the second metal can is mounted to the first metal can.

27. A microelectronic assembly as claimed in claim 20, wherein the first metal can further includes at least one portion extending beyond the at least one edge of the microelectronic device.

28. A microelectronic assembly as claimed in claim 20, wherein the at least one portion of the first metal can overlies at least one of the first conductive elements.

29. A microelectronic assembly as claimed in claim 20, wherein the interconnection element further comprises a reference contact, the microelectronic assembly further comprising a conductive bonding material electrically connecting the first metal can with the reference contact.

30. A microelectronic assembly as claimed in claim 20, wherein the interconnection element further includes a reference contact, the microelectronic assembly further comprising a bond wire electrically connecting the first metal can with the reference contact.

31. A microelectronic assembly as claimed in claim 20, further comprising a bond wire electrically connecting the first and second metal cans.

32. A microelectronic assembly as claimed in claim 20, wherein at least one of the first or second metal cans functions as a heat spreader.

33. A microelectronic assembly as claimed in claim 20, further comprising a dielectric material at least substantially filling spaces surrounding the conductive elements between the first metal can and the first microelectronic device.

34. The microelectronic assembly as claimed in claim 20 wherein the second metal layer is connected to element connects through said first metal layer.

35. The microelectronic assembly as claimed in claim 20 wherein at least some of the plurality of conductive elements connect the second metal layer to the element contacts on the interconnection element.

36. The microelectronic assembly as claimed in claim 20, further comprising an electrically conductive adhesive connecting the first metal layer with a conductive element of the interconnection element.

37. The microelectronic assembly as claimed in claim 36, wherein the adhesive is thermally conductive.

38. The microelectronic assembly as claimed in claim 36, wherein the adhesive is capable of absorbing at least some of the stress caused by thermal expansion mismatch.

39. The microelectronic assembly as claimed in claim 36, further comprising an electrically conductive adhesive connecting the second metal with the first metal layer.

40. The microelectronic assembly as claimed in claim 20, further comprising an electrically conductive adhesive connecting the second metal with the first metal layer.

41. A method of manufacturing a microelectronic assembly comprising:
   providing a first microelectronic assembly including an interconnection element, a first microelectronic device mounted thereto, having a plurality of conductive elements extending between device contacts thereof and at least some first element contacts of the interconnection element;
   forming additional structure including a first metal layer overlying the first microelectronic assembly, the first metal layer having a surface disposed at a substantially uniform spacing from at least substantial portions of the first conductive elements, a second microelectronic device overlying the first metal layer, the second microelectronic device having a surface and device contacts exposed at the surface, second conductive elements extending between the device contacts of the second microelectronic device and at least some second element contacts of the interconnection element, and
   mounting a second metal layer above the second microelectronic device, the second metal layer having a surface disposed at a substantially uniform spacing from at least substantial portions of the second conductive elements, such that a desired impedance is achieved for the first and second conductive elements,
   wherein at least some of the first conductive elements extend beyond at least one edge of the first metal layer to the first element contacts.

42. The method of claim 39, wherein the second element contacts are disposed beyond at least one edge of the first metal layer and wherein a plurality of second conductive elements extend between the device contacts and at least some of the first element contacts, the second conductive elements extending beyond at least one edge of the second microelectronic device to at least some of the second element contacts.

43. A system comprising an assembly according to claim 1 or 20 and one or more other electronic components electrically connected to the assembly.

44. The system as claimed in claim 43 further comprising a housing, the assembly and the other electronic components being mounted to the housing.

45. A microelectronic assembly comprising:
   an interconnection element having a face and a plurality of element contacts and reference contacts exposed at the face;
   a microelectronic device having a rear surface overlying the face of the interconnection element and a front surface having first and second device contacts exposed at the front surface;
   a plurality of first conductive elements connecting first device contacts with the element contacts, the conductive elements having first lengths, and at least substantial portions of the first lengths extending a first height above the surface of the microelectronic device;
   a plurality of second conductive elements connecting the second device contacts with the reference contacts, the second conductive elements having second lengths, and at least substantial portions of the second lengths extending a second height above the surface of the microelectronic device, the second height greater than the first height, the first height being greater than the difference between the first and second heights, such that a desired impedance is achieved for the first conductive elements; and
   a conductive plane attached at least a substantially uniform distance above the at least substantial portions of the first lengths of the first conductive elements, the conductive plane being electrically connected to the second conductive elements and being connectable to a source of reference potential, the conductive plane extending at least substantially parallel to a plane in which the first conductive elements run.

46. A microelectronic assembly comprising:
   an interconnection element having a plurality of element contacts and reference contacts;
   a microelectronic device having a rear surface mounted to the interconnection element and a front surface having first and second device contacts exposed at the front surface;
   a plurality of first conductive elements connecting first device contacts with the element contacts, the conductive elements having runs extending above the surface of the microelectronic device, the first conductive elements being insulatively sheathed;
   a plurality of second conductive elements connecting second device contacts with the reference contacts, the second conductive elements having runs adjacent the runs of the first conductive elements; and
   a conductive plane disposed at least a substantially uniform distance above at least substantial portions of the lengths of the first conductive elements and being connectable to a source of reference potential, the conductive plane extending at least substantially parallel to a plane in which the first conductive elements run; and
   a conductive adhesive electrically connecting the conductive plane with the second conductive elements, such that a desired impedance is achieved for the first conductive elements.

47. The microelectronic assembly of claim 45 or 46, wherein the substantial portion of the first conductive elements or second conductive elements has length of at least 1 millimeter.

48. The microelectronic assembly of claim 45 or 46, wherein the substantial portion of each first conductive element has length of at least 25% of the total length of each respective first conductive element.

49. The microelectronic assembly of claim 45 or 46, wherein the conductive plane directly contacts the second conductive elements.

50. The microelectronic assembly of claim 45 or 46, further comprising a conductive bonding material electrically connecting the conductive plane with the second conductive elements.

51. The microelectronic assembly of claim 45 or 46, wherein the conductive plane functions as a heat spreader.

52. The microelectronic assembly of claim 45 or 46, wherein the conductive plane mechanically supports a second microelectronic device mounted above the conductive plane.

53. The microelectronic element of claim 45 or 46, wherein the second conductive elements extend along a surface of the insulating material.

54. The microelectronic assembly as claimed in claim 45 or 46, wherein the conductive plane overlies a plurality of the runs of the first conductive elements.

55. The microelectronic assembly as claimed in claim 47, wherein the conductive plane is at least generally planar.

56. The microelectronic assembly as claimed in claim 45 or 46, wherein the first and second conductive elements include bond wires.

57. The microelectronic assembly as claimed in claim 45 or 46, wherein the first and second conductive elements are bond wires.

58. The microelectronic assembly as claimed in claim 45 or 46, wherein the interconnection element includes a dielectric element.

59. The microelectronic assembly as claimed in claim 45 or 46, wherein the interconnection element includes a reference contact connectable to the source of reference potential, wherein the conductive material is conductively connected with the reference contact.

60. The microelectronic assembly as claimed in claim 49, wherein the conductive plane is separated from the plurality of first conductive elements by insulating material.

61. The microelectronic assembly as claimed in claim 60, wherein the insulating material at least substantially fills a volume and the plurality of first conductive elements extend through the volume.

62. The microelectronic assembly as claimed in claim 49, wherein the conductive plane is separated from the microelectronic device by an insulating material.

63. A system comprising an assembly according to claim 45 or 46 and one or more other electronic components electrically connected to the assembly.

64. The system as claimed in claim 63 further comprising a housing, the assembly and the other electronic components being mounted to the housing.

* * * * *

UNITED STATES PATENT AND TRADEMARK OFFICE
CERTIFICATE OF CORRECTION

PATENT NO. : 8,222,725 B2  
APPLICATION NO. : 12/883811  
DATED : July 17, 2012  
INVENTOR(S) : Belgacem Haba et al.

Page 1 of 1

It is certified that error appears in the above-identified patent and that said Letters Patent is hereby corrected as shown below:

In the Specification  
Col. 1, line 49, "Impedance" should read --"Impedance--  
Col. 1, line 50, "2-Layer RDL" should read --2-Layer RDL"--  
Col. 2, line 34, "connects" should read --connect--  
Col. 3, line 1, "elements" should read --element--  
Col. 3, line 2, "elements" should read --element--  
Col. 3, line 51, "elements" should read --element--  
Col. 4, line 25, "connects" should read --connect--  
Col. 9, line 27, "voltage, forms" should read --voltage forms--  
Col. 10, line 16, "in form" should read --in the form--  
Col. 10, line 25, "is added" should read --are added--  
Col. 10, line 63, "allow" should read --allows--  
Col. 11, line 47, "in form" should read --in the form--  
Col. 12, line 10, "lengths" should read --length--  
Col. 12, line 12, "extend" should read --extends--

In the Claims  
Col. 15, lines 16-17, "element connects" should read --element contacts--  
Col. 16, lines 56-57, "element connects" should read --element contacts--  
Col. 18, line 8, "attached at least" should read --attached at at least--  
Col. 18, line 32, "disposed at least" should read --disposed at at least--

Signed and Sealed this  
Seventeenth Day of June, 2014

Michelle K. Lee  
*Deputy Director of the United States Patent and Trademark Office*